(12) United States Patent
Nalla et al.

(10) Patent No.: US 8,896,116 B2
(45) Date of Patent: Nov. 25, 2014

(54) MICROELECTRONIC PACKAGE AND METHOD OF MANUFACTURING SAME

(71) Applicants: Ravi K. Nalla, San Jose, CA (US); Mathew J. Manusharow, Phoenix, AZ (US); Drew W. Delaney, Chandler, AZ (US)

(72) Inventors: Ravi K. Nalla, San Jose, CA (US); Mathew J. Manusharow, Phoenix, AZ (US); Drew W. Delaney, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 143 days.

(21) Appl. No.: 13/736,209

(22) Filed: Jan. 8, 2013

(65) Prior Publication Data

US 2013/0119544 A1 May 16, 2013

Related U.S. Application Data

(62) Division of application No. 12/825,729, filed on Jun. 29, 2010, now abandoned.

(51) Int. Cl.
*H01L 23/34* (2006.01)
*H01L 23/48* (2006.01)
(Continued)

(52) U.S. Cl.
CPC ..... *H01L 23/481* (2013.01); *H01L 2224/48227* (2013.01); *H01L 2224/83203* (2013.01); *H01L*
(Continued)

(58) Field of Classification Search
CPC ........... H01L 2224/48091; H01L 2924/01079; H01L 2924/14
USPC ................. 257/E23.145, E23.174, E21.211, 257/E21.597, 621, 723, 734, 737, 741, 774, 257/778; 438/107, 109, 110, 121; 174/257, 174/260
See application file for complete search history.

(56) References Cited

U.S. PATENT DOCUMENTS 7,662,667 B2 * 2/2010 Shen ............................. 438/112
7,714,431 B1 * 5/2010 Huemoeller et al. ......... 257/700
(Continued)

FOREIGN PATENT DOCUMENTS

KR 10-2002-0005823 A 1/2002
TW 200935574 A 8/2009
(Continued)

OTHER PUBLICATIONS

Office Action received for Taiwan Patent Application No. 100122822, mailed on Dec. 24, 2013, 7 Pages of Office Action and 7 Pages of English Translation.

(Continued)

*Primary Examiner* — Chris Chu
(74) *Attorney, Agent, or Firm* — Kenneth A. Nelson

(57) ABSTRACT

A microelectronic package includes a substrate (110), a die (120) embedded within the substrate, the die having a front side (121) and a back side (122) and a through-silicon-via (123) therein, build-up layers (130) built up over the front side of the die, and a power plane (140) in physical contact with the back side of the die. In another embodiment, the microelectronic package comprises a substrate (210), a first die (220) and a second die (260) embedded in the substrate and having a front side (221, 261) and a back side (222, 262) and a through-silicon-via (223, 263) therein, build-up layers (230) over the front sides of the first and second dies, and an electrically conductive structure (240) in physical contact with the back sides of the first and second dies.

13 Claims, 4 Drawing Sheets

(51) Int. Cl.
  *H01L 23/538* (2006.01)
  *H01L 25/065* (2006.01)
  *H01L 23/00* (2006.01)
  *H01L 25/10* (2006.01)

(52) U.S. Cl.
  CPC   *2225/1035* (2013.01); *H01L 24/48* (2013.01); *H01L 24/05* (2013.01); *H01L 2924/01013* (2013.01); *H01L 2924/19042* (2013.01); *H01L 2224/73267* (2013.01); *H01L 2924/01029* (2013.01); *H01L 2924/01019* (2013.01); *H01L 24/06* (2013.01); *H01L 24/82* (2013.01); *H01L 2924/01033* (2013.01); *H01L 23/5389* (2013.01); *H01L 25/105* (2013.01); *H01L 2924/014* (2013.01); *H01L 2924/01005* (2013.01); *H01L 2224/24137* (2013.01); *H01L 2224/04105* (2013.01); *H01L 2924/01076* (2013.01); *H01L 2224/2518* (2013.01); *H01L 24/16* (2013.01); *H01L 2224/16227* (2013.01); *H01L 24/24* (2013.01); *H01L 2224/06181* (2013.01); *H01L 2224/82105* (2013.01); *H01L 24/25* (2013.01); *H01L 24/83* (2013.01); *H01L 2224/32245* (2013.01); *H01L 2224/0557* (2013.01); *H01L 2924/01082* (2013.01); *H01L 2224/05009* (2013.01); *H01L 24/20* (2013.01); *H01L 24/19* (2013.01); *H01L 2224/82106* (2013.01); *H01L 2224/92244* (2013.01); *H01L 2924/19041* (2013.01); *H01L 25/0655* (2013.01)

USPC ............... 257/723; 257/E23.174; 257/621; 257/774; 438/121

(56)  References Cited

U.S. PATENT DOCUMENTS

| | | | |
|---|---|---|---|
| 8,039,303 B2* | 10/2011 | Shim et al. | 438/107 |
| 8,320,134 B2* | 11/2012 | Su et al. | 361/761 |
| 2007/0096292 A1* | 5/2007 | Machida | 257/700 |
| 2007/0289127 A1* | 12/2007 | Hurwitz et al. | 29/827 |
| 2009/0140394 A1* | 6/2009 | Bathan et al. | 257/621 |
| 2010/0244208 A1* | 9/2010 | Pagaila et al. | 257/659 |
| 2010/0301473 A1* | 12/2010 | Sasaoka | 257/737 |
| 2012/0153493 A1* | 6/2012 | Lee et al. | 257/774 |

FOREIGN PATENT DOCUMENTS

| | | |
|---|---|---|
| WO | 2012/006063 A2 | 1/2012 |
| WO | 2012/006063 A3 | 4/2012 |

OTHER PUBLICATIONS

Office Action received for Korean Patent Application No. 10-2012-7031133, mailed on Jan. 20, 2014, 4 Pages of Office Action and 3 Pages of English Translation.

International Preliminary Report on Patentability received for PCT Patent Application No. PCT/US2011/042126, mailed on Jan. 17, 2013, 6 pages.

* cited by examiner

MICROELECTRONIC PACKAGE AND METHOD OF MANUFACTURING SAME

CLAIM OF PRIORITY

This application is a divisional of U.S. patent application Ser. No. 12/825,729, now abandoned, which was filed on Jun. 29, 2010.

FIELD OF THE INVENTION

The disclosed embodiments of the invention relate generally to microelectronic packages and relate more particularly to bumpless build-up layer packages.

BACKGROUND OF THE INVENTION

Bumpless Build-Up Layer (BBUL) is a packaging technology for microelectronic devices in which the package includes at least one die (also referred to as a "chip") embedded in a substrate with one or more build-up layers formed over the substrate. Electrical connections between the build-up layers and the die bond pads may be made using standard microvia formation processes. BBUL packages enable small electrical loop inductance and reduced thermomechanical stresses on low dielectric constant (low-k) die materials. They also allow high lead count, ready integration of multiple electronic and optical components (such as logic, memory, radio frequency (RF), and microelectromechanical systems (MEMS), among others), and inherent scalability. Existing process flows for BBUL packages involve the building of the substrate on a temporary core/carrier capped with a copper foil that is etched off after the package is separated from the core/carrier.

BRIEF DESCRIPTION OF THE DRAWINGS

The disclosed embodiments will be better understood from a reading of the following detailed description, taken in conjunction with the accompanying figures in the drawings in which.

Figure 1A:
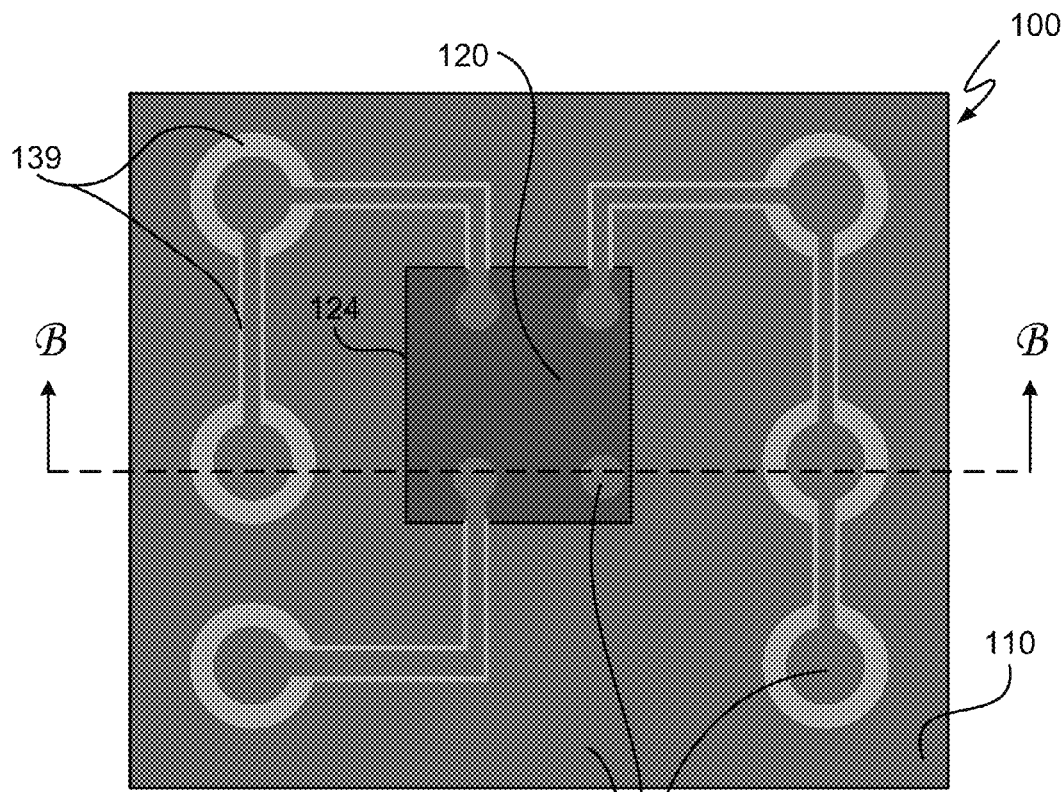
FIGS. 1A and 1B are, respectively, a plan view and a cross-sectional view of a microelectronic package according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements, while similar reference numerals may, but do not necessarily, denote similar elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions unless otherwise indicated either specifically or by context. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, a microelectronic package comprises a substrate, a die (which may also be referred to herein as a chip) embedded within the substrate—the die having a front side and an opposing back side and further having at least one through-silicon-via therein, a plurality of build-up layers adjacent to and built up over the front side of the die, and a power plane adjacent to and in physical contact with the back side of the die. In another embodiment, the microelectronic package comprises a substrate, a first die and a second die, both of which are embedded in the substrate, both of which have a front side and an opposing back side, and both of which have at least one through-silicon-via therein, a plurality of build-up layers adjacent to and built up over the front sides of the first and second dies, and an electrically conductive structure adjacent to and in physical contact with the back sides of the first and second dies.

As the following discussion will make clear, embodiments of the invention enable a reduction in the number of power bumps (or other kinds of bumps) on the active side of a die, thus facilitating a reduction in die size. Furthermore, embodiments of the invention enable what may be referred to as Die-Down Power-Up (DDPU) systems, which among other advantages offer better second level interconnect (SLI) return path optimization, make possible increased signal-to-ground for the input/output (I/O) elements, and eliminate troublesome tradeoffs between I/O and power. The same or other embodiments of the invention enable an increase in achievable I/O density between multiple dies in the package.

Figure 1B:
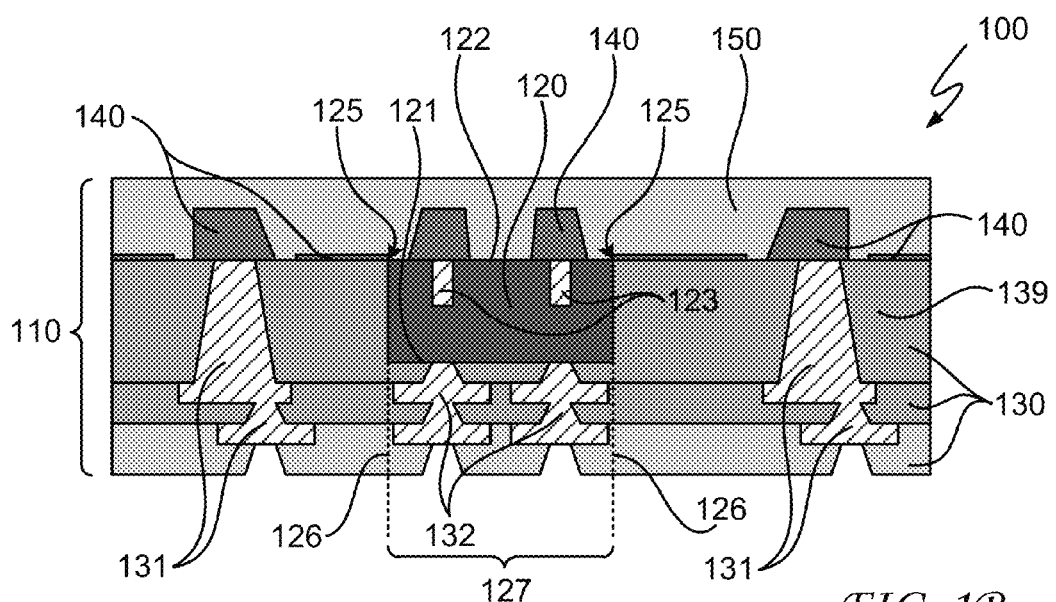

Referring now to the drawings, FIG. 1A is a plan view and FIG. 1B is a cross-sectional view of a microelectronic package 100 according to an embodiment of the invention. FIG. 1B is taken along a line B-B in FIG. 1A. As illustrated in FIGS. 1A and 1B, microelectronic package 100 comprises a substrate 110 and a die 120 that is embedded within substrate 110. Die 120 has a front side 121 (i.e., the side on which the transistors (not shown) are located) and an opposing back side 122. Die 120 further has therein a through-silicon-via (TSV) 123 that extends all the way to and is exposed at back side 122. Substrate 110 comprises a plurality of build-up layers 130 (one of which is a dielectric layer 139) adjacent to and built up over (and around) front side 121 of die 120.

Microelectronic package 100 further comprises a power plane 140 adjacent to and in physical contact with back side 122 of die 120. A thickness of power plane 140 may be dictated by the power delivery requirements of microelectronic package 100. The presence of power plane 140 enables a reduction in the number of power bumps (or I/O bumps or possibly dummy bumps) on front side 121, as well as a corresponding reduction in the size of die 120, because some of the required bumps may instead be formed within power plane 140 in a location (back side 122) that was formerly unused or wasted space. In other words, by moving some power or other bumps to back side 122, embodiments of the invention enable a reduction in die footprint without compromising on power and I/O capability. Furthermore, embodiments of the invention allow power circuits to be brought into the die either from the bottom or from the top of the die (or both), whereas previously all power had to be brought in from the bottom. (This was true even if power was brought in to the top side of a package; i.e., top side package power would have to be routed to and brought into the die from the bottom side of the die.) Embodiments of the invention eliminate that requirement, and instead enable a two-sided, functional part where before the only functional parts were one-sided.

As mentioned, embodiments of the invention enable DDPU systems, in which power is brought into a die from a side opposite that where the active devices are located. As was also mentioned, DDPU systems, by providing more bumps (even in a smaller footprint), enjoy advantages such as improved SLI return path optimization and increased I/O signal to ground ratio.

Power plane 140 rests on top of the exposed portion of TSV 123 at back side 122, meaning that a connection may be made between power plane 140 and TSV 123 (and from there to other parts of die 120) without the need for any connection bumps at back side 122. In one embodiment, power plane 140 comprises copper, a material that is compatible with existing equipment and technology processes. In the illustrated embodiment, microelectronic package 100 further comprises a protective layer 150 located over power plane 140 in order to protect the power plane from mechanical or environmental damage (such as oxidation) or the like. (In order to permit greater clarity of illustration, protective layer 150 is not shown in FIG. 1A.) As an example, protective layer 150 can be an aluminum oxide or a similar layer formed as a result of a chemical treatment performed to reduce corrosion and the like. As another example, protective layer 150 can be an overmold made of a polymer material, a fiber-reinforced plastic, or the like.

Although not shown in FIGS. 1A and 1B, power plane 140 may in certain embodiments act as an attachment point for one or more passive components (e.g., capacitors, inductors, etc.). In some of these (or other) non-illustrated embodiments, power plane 140 may have a recess therein that encloses some or all of die 120. This recessed configuration allows the overall thickness (often referred to as the Z-height) of microelectronic package 100 to be reduced such that it would, among other advantages, be compatible with devices and products having smaller form factors.

FIG. 1A depicts a perimeter 124 of die 120. FIG. 1B shows only two endpoints 125 of perimeter 124 and only shows an outer boundary 126 of an extension of that perimeter through substrate 110. That extension (or footprint) defines a die area 127, the lateral extent of which is indicated in FIG. 1B. It may be seen that build-up layers 130 contain a plurality of vias 131 outside die area 127 and a plurality of vias 132 inside die area 127. In the illustrated embodiment, vias 131 electrically connect power plane 140 and substrate 110 to each other and vias 132 electrically connect die 120 and substrate 110 to each other.

Vias 131 that are outside die area 127 require a larger drill size because they are piercing through a thicker dielectric—in other words, they are longer. In that regard, an additional advantage of the recessed configuration described above is that it would reduce the aspect ratio of the POP vias (vias 131) thus making those vias easier and cheaper to manufacture. Vias 132 are shorter because they just have to reach to die 120 and not all the way to carrier 140. Thus, smaller lasers could be used for vias 132 than for vias 131. As an example, the vias can be created using semi-additive process (SAP) techniques, laser projection patterning (LPP) techniques, or any other suitable via formation technique.

Figure 2A:
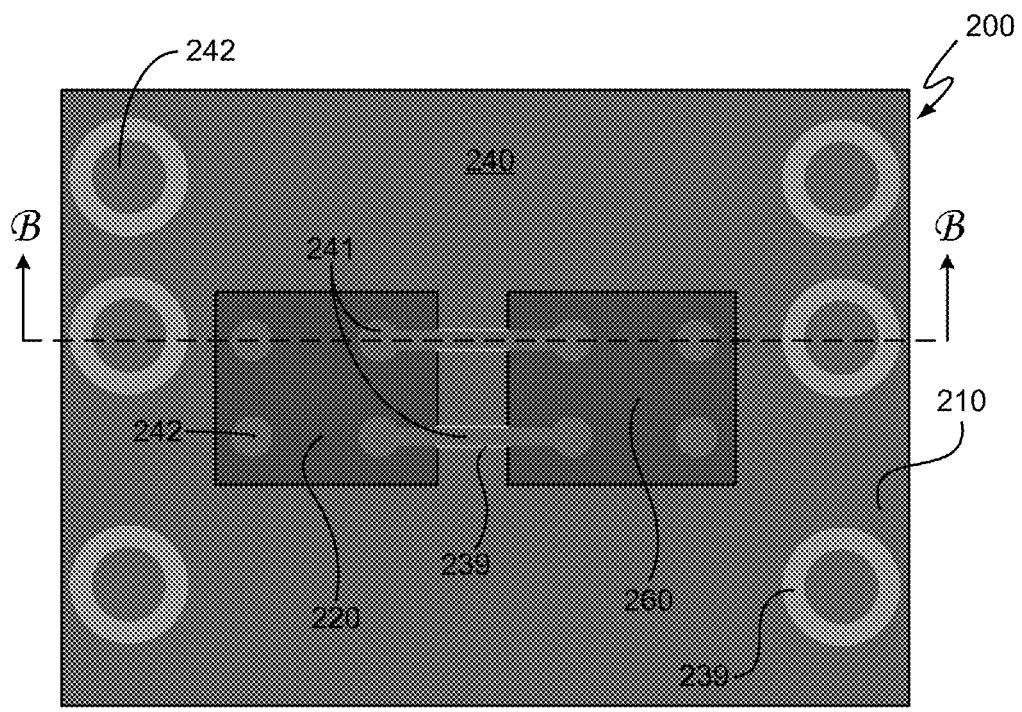
FIGS. 2A and 2B are, respectively, a plan view and a cross-sectional view of a microelectronic package according to another embodiment of the invention.
Figure 2B:
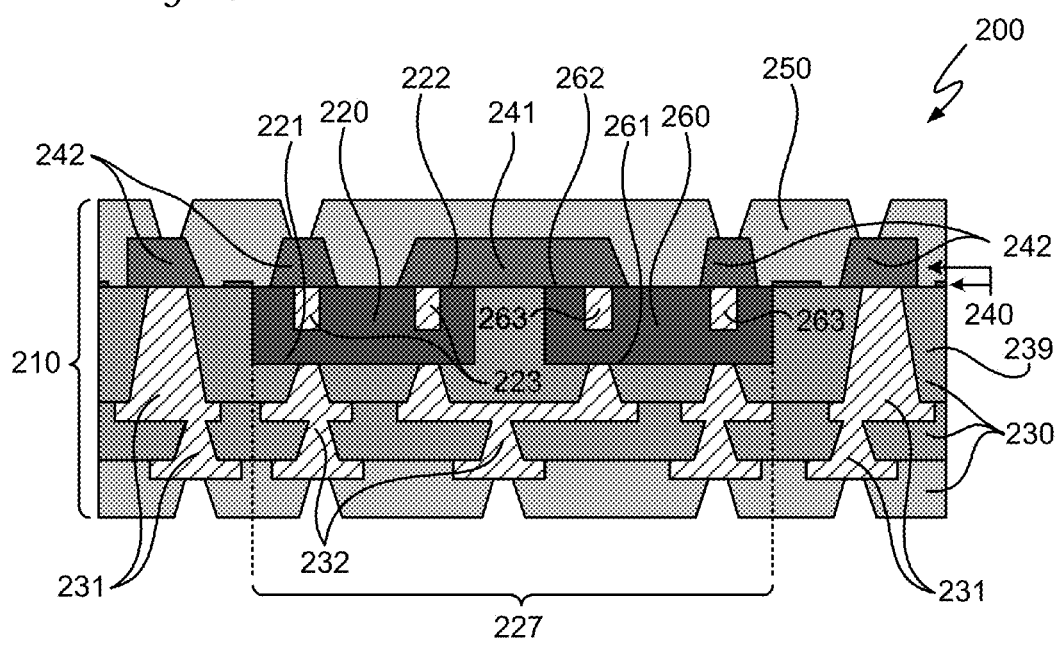

FIG. 2A is a plan view and FIG. 2B is a cross-sectional view of a microelectronic package 200 according to an embodiment of the invention. FIG. 2B is taken along a line B-B in FIG. 2A. As illustrated in FIGS. 2A and 2B, microelectronic package 200 comprises a substrate 210 with a die 220 and a die 260 embedded therein. Die 220 has a front side 221 (i.e., the side on which the transistors (not shown) are located) and an opposing back side 222. Die 220 further has therein a TSV 223 that extends all the way to and is exposed at back side 222. Similarly, die 260 has a front side 261 (again, the side on which the transistors (not shown) are located) and an opposing back side 262. Die 260 further has therein a TSV 263 that extends all the way to and is exposed at back side 262. Substrate 210 comprises a plurality of build-up layers 230 (one of which is a dielectric layer 239) adjacent to and built up over (and around) front sides 221 and 261 of dies 220 and 260.

Microelectronic package 200 further comprises an electrically conductive structure 240 adjacent to and in physical contact with back side 222 of die 220 and back side 262 of die 260. In the illustrated embodiment, electrically conductive structure 240 comprises an interconnect 241 (e.g., an I/O inter-die connection) that electrically connects back side 222 of die 220 and back side 262 of die 260 to each other. Electrically conductive structure 240 further comprises die connection pads 242 that can be used for die stacking. (Die stacking according to embodiments of the invention, including the role of die connection pads 242, will be further discussed below.)

In one embodiment, electrically conductive structure 240 comprises copper. In the same or another embodiment microelectronic package 200 further comprises a protective layer 250 over electrically conductive structure 240 in order to protect the electrically conductive structure from mechanical or environmental damage or the like. (In order to permit greater clarity of illustration, protective layer 250 is not shown in FIG. 2A.) As an example, protective layer 250 can be similar to protective layer 150 that is shown in FIGS. 1A and 1B.

In one embodiment, electrically conductive structure 240 may have a recess (not shown) therein that encloses some or all of dies 220 and 260. In certain embodiments, electrically conductive structure 240 may contain separate recesses for each die.

An extension (or footprint) of dies 220 and 260 (including the area in between them) defines a die area 227, the lateral extent of which is indicated in FIG. 2B. It may be seen that build-up layers 230 contain a plurality of vias 231 outside die area 227 and a plurality of vias 232 inside die area 227. In the illustrated embodiment, plurality of vias 231 electrically connect die connection pads 242 and substrate 210 to each other and plurality of vias 232 electrically connect dies 220 and 260 and substrate 210 to each other. As shown, die connection pads 242 can be located both on top of vias 232 and on top of TSVs not used for I/O connections.

Die-to-die interconnects in a multi-chip package environment are very expensive and difficult to scale down in order to keep up with overall device scaling. These difficulties and expenses are reduced or avoided by embodiments of the invention, which increase interconnect density not by reducing line and space width but by placing some of the interconnects in a previously-unused location: the back side of the dies. Embodiments of the invention may thus be used to roughly double the number of interconnects that a given die size may accommodate.

Figure 3:
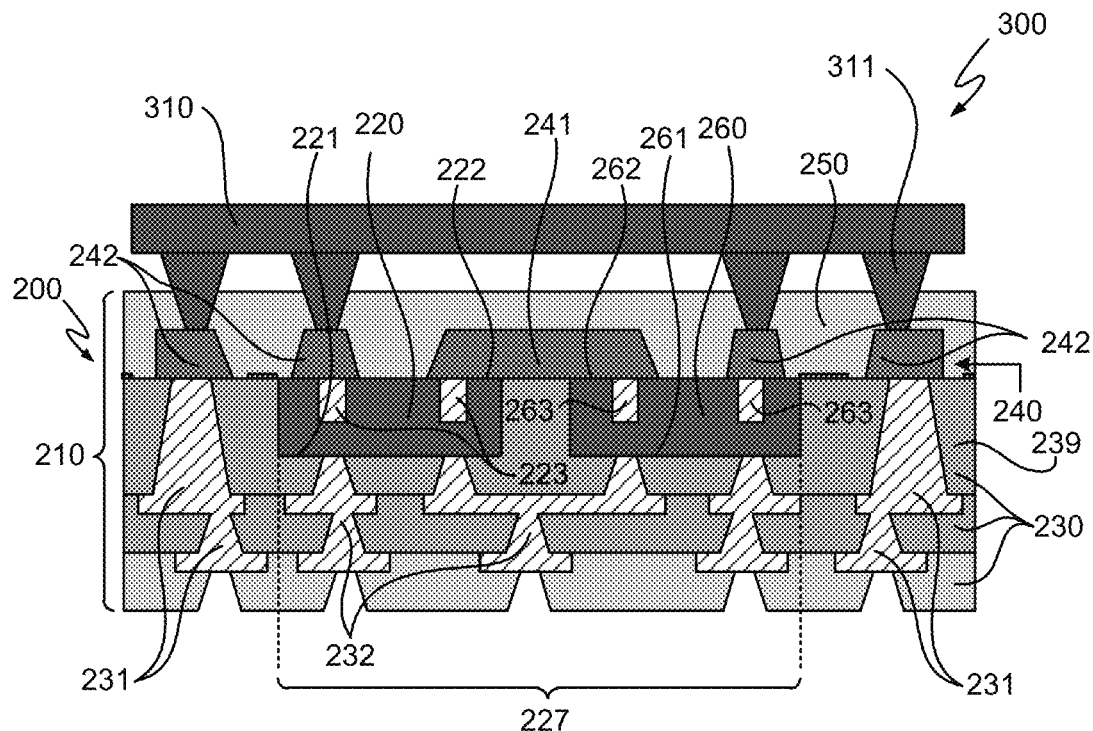
FIG. 3 is a cross-sectional view of a multi-chip package according to an embodiment of the invention.

FIG. 3 is a cross-sectional view of a multi-chip package 300 according to an embodiment of the invention that includes microelectronic package 200, with its dies 220 and 260, as well as an additional die 310. Die 310 is connected to die connection pads 242, and thus to vias 231 and substrate 210, by interconnects 311. In a non-illustrated embodiment, wire bonds or other connection mechanisms may be used in place of the solder connections shown in FIG. 3. This and other package on package (POP) or package in package (PIP) configurations are desirable in that they have a greatly reduced height or thickness because of the BBUL architecture. Moreover, embodiments of the invention enable I/Os to be much more dense than is true for existing POP architectures, where perhaps two or three rows of bumps (on which to land an additional package) are all that the package can accommodate, and all of the connections on the outside of the overall package have to go through the bottom package before being routed to the die. Embodiments of the invention allow some or all such connections to be formed on the die back side and also allow them to be more dense. Entire arrays of connections are possible, where even the back sides of the dies are at least partially covered with connections. Furthermore, the electrically conductive structure itself can serve as an additional routing layer.

Figure 4:
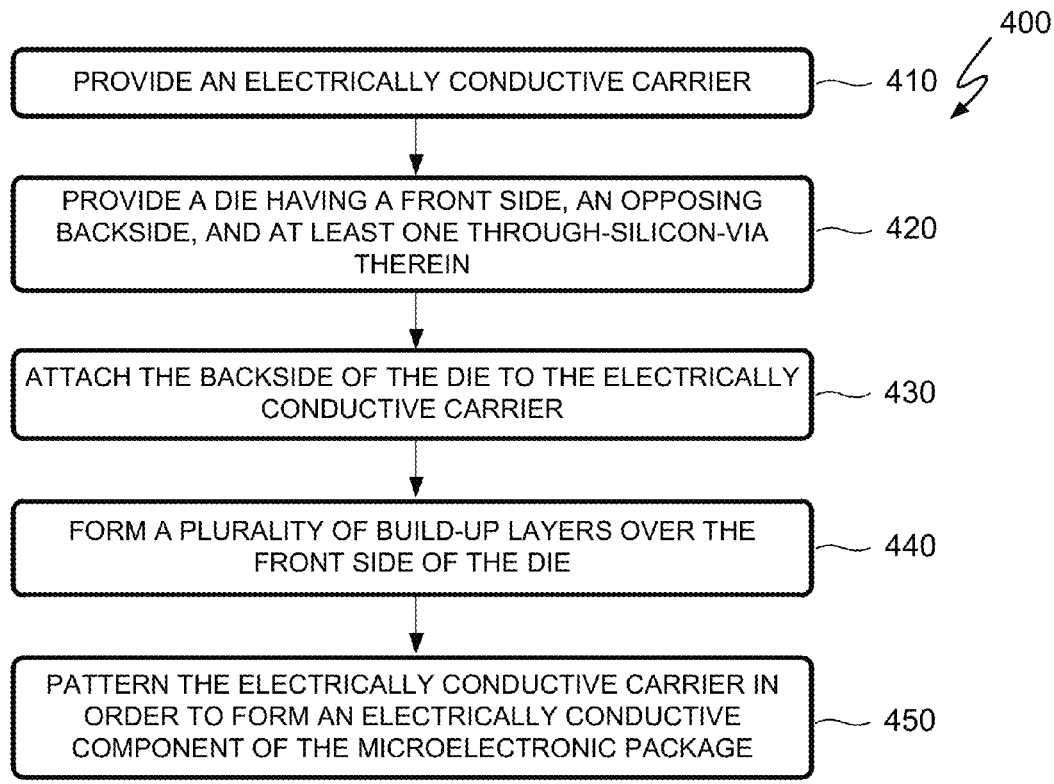
FIG. 4 is a flowchart illustrating a method of manufacturing a microelectronic package according to an embodiment of the invention.

FIG. 4 is a flowchart illustrating a method 400 of manufacturing a microelectronic package according to an embodiment of the invention. As an example, method 400 may result in the formation of a microelectronic package that is similar to microelectronic package 100 that is shown in FIGS. 1A and 1B or to microelectronic package 200 that is shown in FIGS. 2A, 2B, and 3.

A step 410 of method 400 is to provide an electrically conductive carrier. As an example, the electrically conductive carrier can be similar to an electrically conductive carrier 510 that is first shown in FIG. 5. This electrically conductive carrier can be, for example, a copper foil or the like attached to a peelable core or other temporary or sacrificial carrier structure. The thickness of the foil may be dictated by the power delivery requirements of the microelectronic package. If desired, a multi-layer foil may be used, possibly with a recess that may (in a subsequent step) receive a die. A multi-layer foil may provide needed flexibility in cases where the foil thickness above the die, for example, needs to be different from the foil thickness elsewhere. As other examples, a multi-layer foil may also offer advantages in terms of the creation of multi-layer passive devices, and it may help improve warpage.

A step 420 of method 400 is to provide a die having a front side, an opposing back side, and at least one through-silicon-via therein. As an example, the die can be similar to one or more of die 120, die 220, and die 260, shown in FIGS. 1A, 1B, 2A, 2B, and 3, and can also be similar to a die 520 that is first shown in FIG. 5. As illustrated, die 520 has a front side 521, a back side 522, and a TSV 523. In certain embodiments, multiple dies may be provided, as illustrated by the second (unlabeled) die shown in FIG. 5. (It should be understood that the number of dies is not limited to just one or two; rather, any number of dies, as required or appropriate for the desired microelectronic package, may be provided.)

Figure 5:
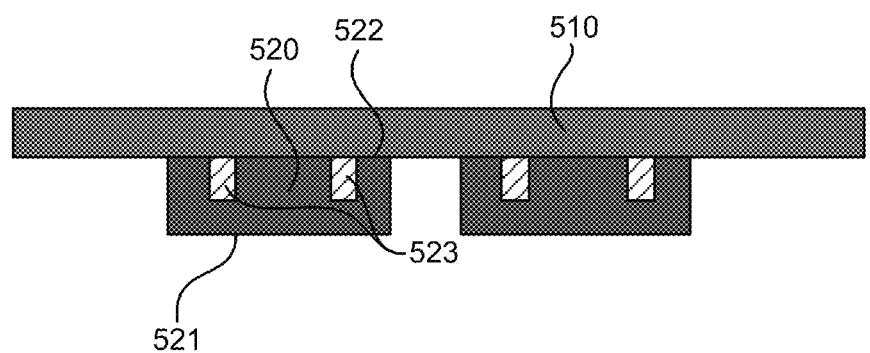
FIG. 5 is a cross-sectional view of a portion of a microelectronic package at a particular point in its manufacturing process according to an embodiment of the invention.

A step 430 of method 400 is to attach the back side of the die to the electrically conductive carrier. This can be achieved, for example, by dispensing conductive adhesive or solder or the like on the TSV pads (or, if the TSVs do not have pads, on the ends of the TSVs themselves) and using thermocompression bonding or the like to adhere the die (or dies) onto the foil. As an example, these connections may serve to deliver power to the die. FIG. 5 depicts die 520 after it has already been attached to back side 522 of die 520.

A step 440 of method 400 is to form a plurality of build-up layers over the front side of the die. A first (or an early) portion of this step may be to laminate or otherwise form a dielectric film on the entire panel, thus providing a level plane for the balance of the build-up process. Roughening of the copper film may be performed prior to lamination in order to aid with adhesion to the dielectric film. Smaller vias may be formed in the die area landing on the pads (e.g., copper pads) on the die. Larger vias may be formed outside the die area to connect the electrically conductive carrier (after it is functionalized as described below) into the substrate or to connect to pads that can be used to stack additional die or packages on top of the microelectronic package.

Additional layers may then be built up over the dielectric film. For example, SAP techniques may be used to plate the vias landing on the die pads and the first metal layer of the substrate portion of the package. LPP or other techniques may also be used. I/O connections to and from the die can be made on first metal layer or on subsequent layers, which may be formed using standard substrate SAP (or other) build-up methods to form the remainder of the package. When the build-up is complete, the package together with the copper foil may be separated off the remainder of the temporary core/carrier.

Figure 6:
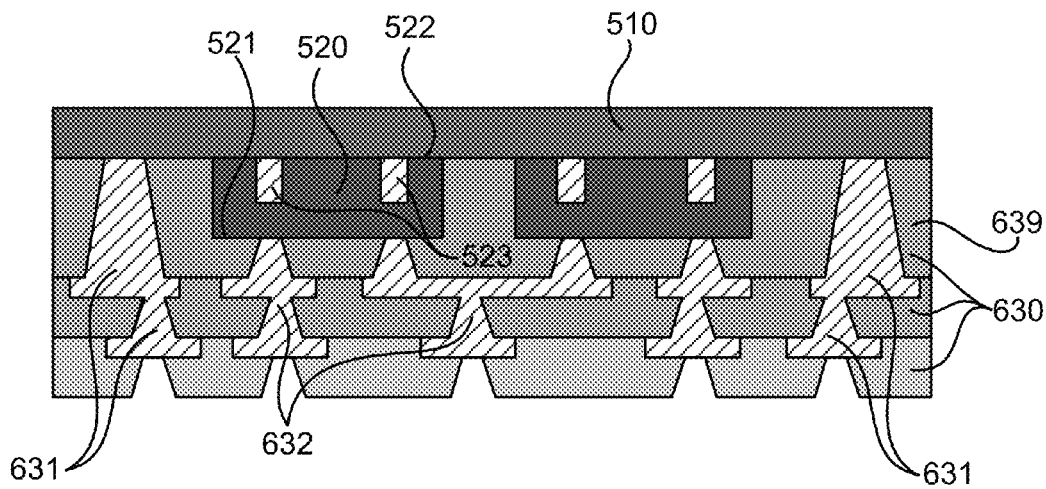
FIG. 6 is a cross-sectional view of a portion of the microelectronic package of FIG. 5 at a subsequent point in its manufacturing process according to an embodiment of the invention.

As an example, the build-up layers, the larger vias, the smaller vias, and the dielectric film can be similar to, respectively, build-up layers 630, vias 631, vias 632, and dielectric film 639, all of which are shown in FIG. 6. Build-up layers 630 can also be similar to build-up layers 130 (shown in FIG. 1B) and 230 (first shown in FIG. 2B). Vias 631 can also be similar to vias 131 (see FIG. 1B) and 231 (see FIGS. 2B and 3), while vias 632 can also be similar to vias 132 (see FIG. 1B)

and 232 (see FIGS. 2B and 3). Dielectric film 639 can also be similar to dielectric layers 139 (see FIGS. 1A and 1B) and 239 (see FIGS. 2A, 2B, and 3).

A step 450 of method 400 is to pattern the electrically conductive carrier in order to form an electrically conductive component of the microelectronic package. In one embodiment this electrically conductive component is a power plane. FIGS. 1A and 1B show an example of a microelectronic package that results from the performance of this embodiment of method 400.

In a particular embodiment, step 450 or another step can comprise electrically connecting the power plane and the substrate to a power source (e.g., a power rail). As an example, step 450 may comprise laminating dry film or the like on the top of the copper foil and then performing subtractive patterning in order to form the power plane. Connections may be made on this to connect the power from the power carrying vias outside the die to the die through the TSVs.

In another embodiment (where the microelectronic package comprises multiple dies) the electrically conductive component is an electrical connection between two (or more) of the dies. FIGS. 2A, 2B, and 3 show an example of a microelectronic package that results from the performance of this embodiment of method 400. As an example, step 450 may comprise laminating dry film or the like on the top of the copper foil and then performing subtractive patterning in order to form additional I/O connections through the TSVs. Pads that can be used to stack die or packages on top can also be created both on top of vias outside the die area and on top of the TSVs not used for I/O connections. These pads can be similar to die connection pads 242 that are first shown in FIGS. 2A and 2B.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the microelectronic packages and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A microelectronic package comprising:
   a substrate;
   a first die and a second die, both of which are embedded in the substrate, both of which have a front side and an opposing back side, and both of which have at least one through-silicon-via therein;
   a plurality of build-up layers adjacent to and built up over the front sides of the first and second dies; and
   an electrically conductive structure adjacent to and in physical contact with the back sides of the first and second dies.

2. The microelectronic package of claim 1 wherein:
   the electrically conductive structure comprises:
      an interconnect that electrically connects the back sides of the first and second dies to each other; and
      a die connection pad.

3. The microelectronic package of claim 2 wherein:
   the first die has a first die perimeter and the second die has a second die perimeter;
   an extension of the first and second die perimeters through the build-up layers defines a die area; and
   the build-up layers contain a first plurality of vias outside the die area and a second plurality of vias inside the die area.

4. The microelectronic package of claim 3 wherein:
   the first plurality of vias electrically connect the die connection pad and the substrate to each other; and
   the second plurality of vias electrically connect the first and second dies and the substrate to each other.

5. The microelectronic package of claim 1 wherein:
   the electrically conductive structure comprises copper.

6. The microelectronic package of claim 1 further comprising:
   a protective layer over the electrically conductive structure.

7. The microelectronic package of claim 1 wherein:
   the electrically conductive structure has a recess therein; and
   the first die and the second die are at least partially located within the recess.

8. A method of manufacturing a microelectronic package, the method comprising:
   providing an electrically conductive carrier;
   providing a first die and a second die, the first die having a front side, an opposing back side, and at least one through-silicon-via therein;
   attaching the back side of the first die to the electrically conductive carrier;
   forming a plurality of build-up layers over the front side of the first die, the build-up layers and the electrically conductive carrier forming part of a substrate of the microelectronic package; and
   patterning the electrically conductive carrier in order to form an electrically conductive component of the microelectronic package, the electrically conductive component being an electrical connection between the first die and the second die.

9. The method of claim 8 wherein:
   the electrically conductive component is a power plane.

10. The method of claim 9 further comprising:
    electrically connecting the power plane to a power source; and
    electrically connecting the substrate to the power source.

11. The method of claim 8 wherein:
    the electrically conductive carrier comprises copper.

12. The method of claim 8 further comprising:
    forming a plurality of connection pads adjacent to the electrically conductive component.

13. The method of claim 8 wherein:
    providing the electrically conductive carrier comprises providing a copper foil attached to a sacrificial core;
    the method further comprises separating the copper foil from the sacrificial core after the build-up layers are completed; and patterning the electrically conductive carrier in order to form the electrically conductive component of the microelectronic package comprises patterning the copper foil.

\* \* \* \* \*